United States Patent
Butler et al.

(10) Patent No.: US 9,146,808 B1
(45) Date of Patent: Sep. 29, 2015

(54) SOFT ERROR PROTECTION FOR CONTENT ADDRESSABLE MEMORY

(71) Applicant: EMULEX CORPORATION, Costa Mesa, CA (US)

(72) Inventors: Jim Butler, Sierra Madre, CA (US); Sujith Arramreddy, San Jose, CA (US)

(73) Assignee: EMULEX CORPORATION, Costa Mesa, CA (US)

( * ) Notice: Subject to any disclaimer, the term of this patent is extended or adjusted under 35 U.S.C. 154(b) by 163 days.

(21) Appl. No.: 13/749,669

(22) Filed: Jan. 24, 2013

(51) Int. Cl.
*G11C 29/00* (2006.01)
*G06F 11/10* (2006.01)
*G11C 15/04* (2006.01)

(52) U.S. Cl.
CPC ............ *G06F 11/1064* (2013.01); *G11C 15/04* (2013.01)

(58) Field of Classification Search
CPC ............ G06F 11/1076; G06F 11/1008; G06F 11/1004; H05K 999/99; G11B 20/1833
USPC .......................................................... 714/766
See application file for complete search history.

(56) References Cited

U.S. PATENT DOCUMENTS

| | | | | |
|---|---|---|---|---|
| 5,245,617 A | * | 9/1993 | DeSouza et al. | 714/766 |
| 6,507,898 B1 | * | 1/2003 | Gibson et al. | 711/168 |
| 2005/0105625 A1 | * | 5/2005 | Kim et al. | 375/240.27 |
| 2006/0198215 A1 | * | 9/2006 | Perner et al. | 365/200 |
| 2010/0157757 A1 | * | 6/2010 | Ross et al. | 369/47.17 |
| 2014/0143634 A1 | * | 5/2014 | Post | 714/764 |
| 2015/0006996 A1 | * | 1/2015 | Volvovski et al. | 714/766 |

* cited by examiner

*Primary Examiner* — Albert Decady
*Assistant Examiner* — Enam Ahmed
(74) *Attorney, Agent, or Firm* — McAndrews, Held & Malloy Ltd.

(57) ABSTRACT

In one embodiment of the invention, a method for protecting a content addressable memory is disclosed. The method includes storing a marker bit associated with each data block stored in a random access memory (RAM), states of the marker bit representing whether the data block was recently read from the RAM or recently written into the RAM; receiving a client address pointing to a starting address of a data block stored in the RAM; comparing the client address against one or more addresses stored in a content addressable memory (CAM) to determine a hit indicating the client address was stored in the CAM or a miss indicating the client address was not stored in the CAM; and in response to a miss, the method further includes checking a state of the marker bit associated with the data block pointed to by the client address.

25 Claims, 5 Drawing Sheets

FIG. 2A

MISS ↑

202A — 200A

HIT/POINTER ←

|   | | | | |
|---|---|---|---|---|
| 0 | 0 | 1 | 1 | 0 |
| 1 | 1 | 0 | 0 | 1 |
| 2 | 0 | 1 | 0 | 1 |
| 3 | 1 | 0 | 1 | 0 | — 204A
| 4 | 0 | 1 | 0 | 0 |

CLIENT INPUT

FIG. 2B

FALSE MISS ↑

202B — 200B

|   | | | | |
|---|---|---|---|---|
| 0 | 0 | 1 | 1 | 0 |
| 1 | <u>0</u> | 0 | 0 | 1 |
| 2 | 0 | 1 | 0 | 1 |
| 3 | 1 | <u>1</u> | 1 | 0 | — 204B

FALSE HIT ←

| 4 | 0 | 1 | 0 | 0 |

CLIENT INPUT

|   | | | | |
|---|---|---|---|---|
| 0 | 0 | 1 | 1 | 0 |
| 1 | 1 | 0 | 0 | 1 |
| 2 | 0 | 1 | 0 | 1 |
| 3 | 1 | 0 | 1 | 0 | — 204C
| 4 | 0 | 1 | 0 | 0 |

CLIENT INPUT

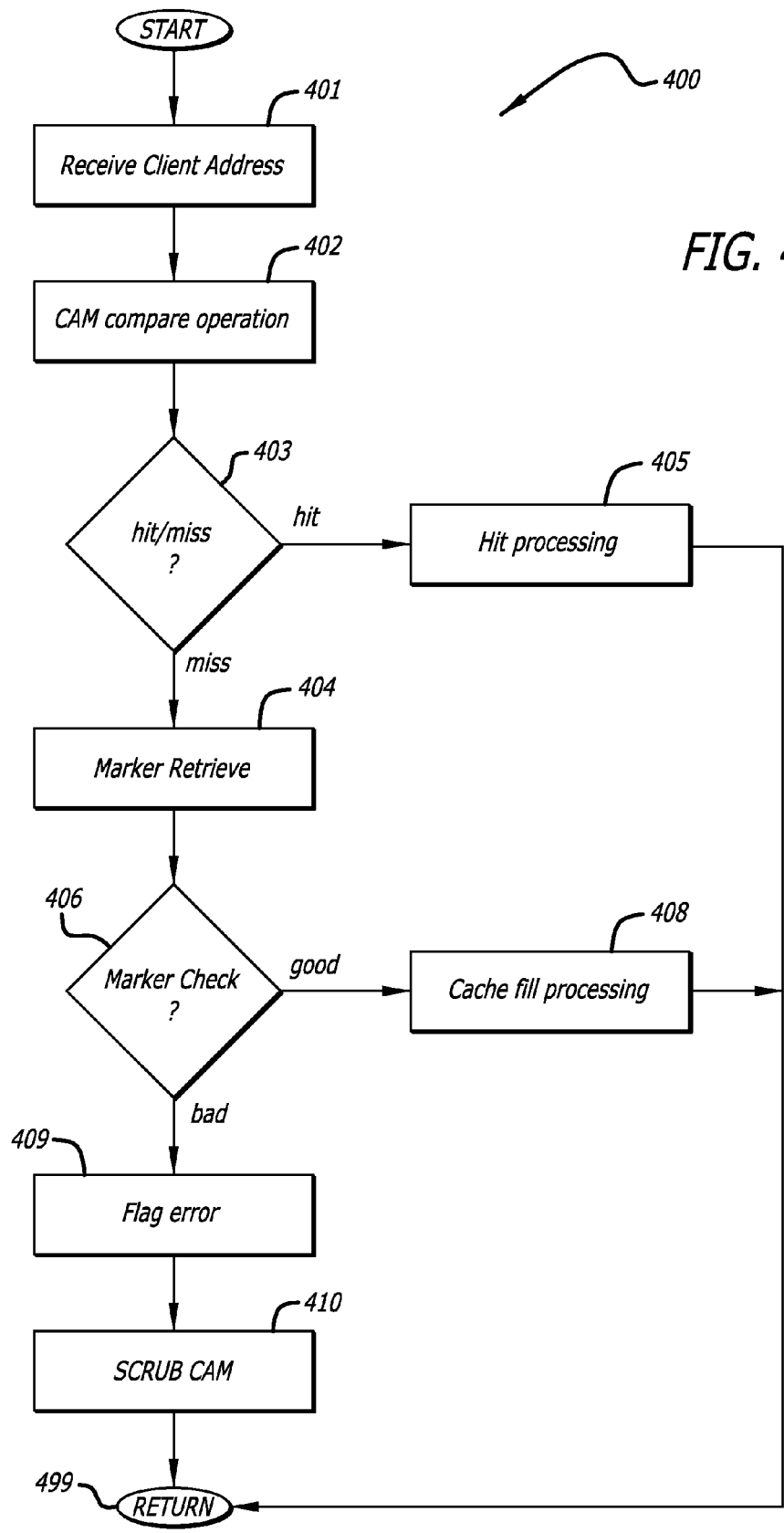

SOFT ERROR PROTECTION FOR CONTENT ADDRESSABLE MEMORY

FIELD

The embodiments of the invention relate generally to digital error detection and correction for memory.

BACKGROUND

A semiconductor memory may experience a hard error or a soft error. A hard error occurs when a read writeable semiconductor memory cell becomes stuck at one logical state and will not change to another logical state to store a data bit. A soft error occurs when the stored logical state of a read writeable semiconductor memory cell is upset and changes, such as from logical one to logical zero or from logical zero to logical one.

A soft error may be due to alpha particles, released from cosmic ray impacts for example, that upset the electronic charges representing the logical state stored in a memory cell. Alternatively, a soft error may be due to inadvertent decay in the electronic charges stored in a memory cell, such as from the age and decay of materials used in the manufacture of memory. A soft error may alternatively occur from electrical noise in a circuit coupled into a memory cell to alter the stored charges therein. In any case, the memory cell is usually not damaged and can be rewritten (referred to as scrubbed) to store the proper charge and logic state of data again.

There are different kinds of semiconductor memory with different kinds of semiconductor memory cells. Content addressable memory (CAM), also referred to as associative memory, is a type of semiconductor memory that functionally differs from a random access memory (RAM), such as a static random access memory (SRAM) or a dynamic random access memory (DRAM). With decreased transistor sizes due to semiconductor manufacturing improvements, more recently designed CAMs have greater capacities and have become less expensive to integrate into an integrated circuit. Thus, CAMs have become more popular to use as a component in integrated circuits. However, smaller transistor sizes and lower power supplies have made memory cells, such as those found in CAMs, more susceptible to soft errors.

With a RAM, in the case of a read operation, a memory address is provided to the RAM to read data out from memory locations therein associated with the supplied memory address. In the case of a write operation, a memory address is provided to the RAM to write data into memory locations therein associated with the supplied memory address.

With a CAM, data (e.g., address into another memory) may be randomly stored into lines of its memory locations (CAM lines) similar to a database. Like a search on a database, it is desirable to know if certain given data is stored in the CAM and if so, what CAM lines match the certain given data. The address of the CAM lines that match, referred to as a tag or pointer, often points to further information in a different memory. For example, a client supplies a word of data (a "client data word") that may or may not be stored in the CAM. The CAM searches throughout the words of data stored into the CAM lines for the client data word. If the client data word is found stored in the CAM, referred to as a hit, one or more addresses where the client data word is found are returned to the client. If the client data word is not found stored in the CAM, referred to as a miss, a miss signal is generated by the CAM.

The longer period of time that data is stored in a memory cell, the greater the probability it may experience a soft error. If a memory cell is refreshed periodically with new or rewritten data, the probability it experiences a soft error is less. In a CAM, data may be stored in the memory cells of CAM lines for a long period of time such that it may be more susceptible to soft errors. Furthermore, a greater storage capacity or size of a memory, increases the probability it may experience a soft error. Thus, larger CAMs may be more susceptible to soft errors.

The way in which CAMs function—stored data in all CAM lines is compared to a certain given data—makes it difficult to detect a changed bit due to soft error. If a soft error occurs in a CAM, a false miss or false hit may be generated which is undesirable. A false miss is particularly problematic, because the pointer provided by the CAM address is lost. A false hit is less problematic because it is easier to detect a false pointer provided by a false match in a CAM.

It is desirable to improve the control and operation of CAMs such that false misses can be detected in order to reduce failure rates and improve reliability of the overall systems that include CAMs.

BRIEF SUMMARY

The embodiments of the invention are summarized by the claims that follow below.

BRIEF DESCRIPTIONS OF THE DRAWINGS

FIG. 2A is an exemplary diagram of lines of content addressable memory and memory address contents stored in each.

FIG. 2B is an exemplary diagram of lines of content addressable memory with a couple of soft errors that may generate a false miss or a false hit.

FIG. 2C is an exemplary diagram of lines of content addressable memory with the soft errors corrected by a memory scrub operation.

FIG. 4 is a flow chart diagram of a method of soft error protection for a false miss in a content addressable memory.

DETAILED DESCRIPTION

Figure 1:
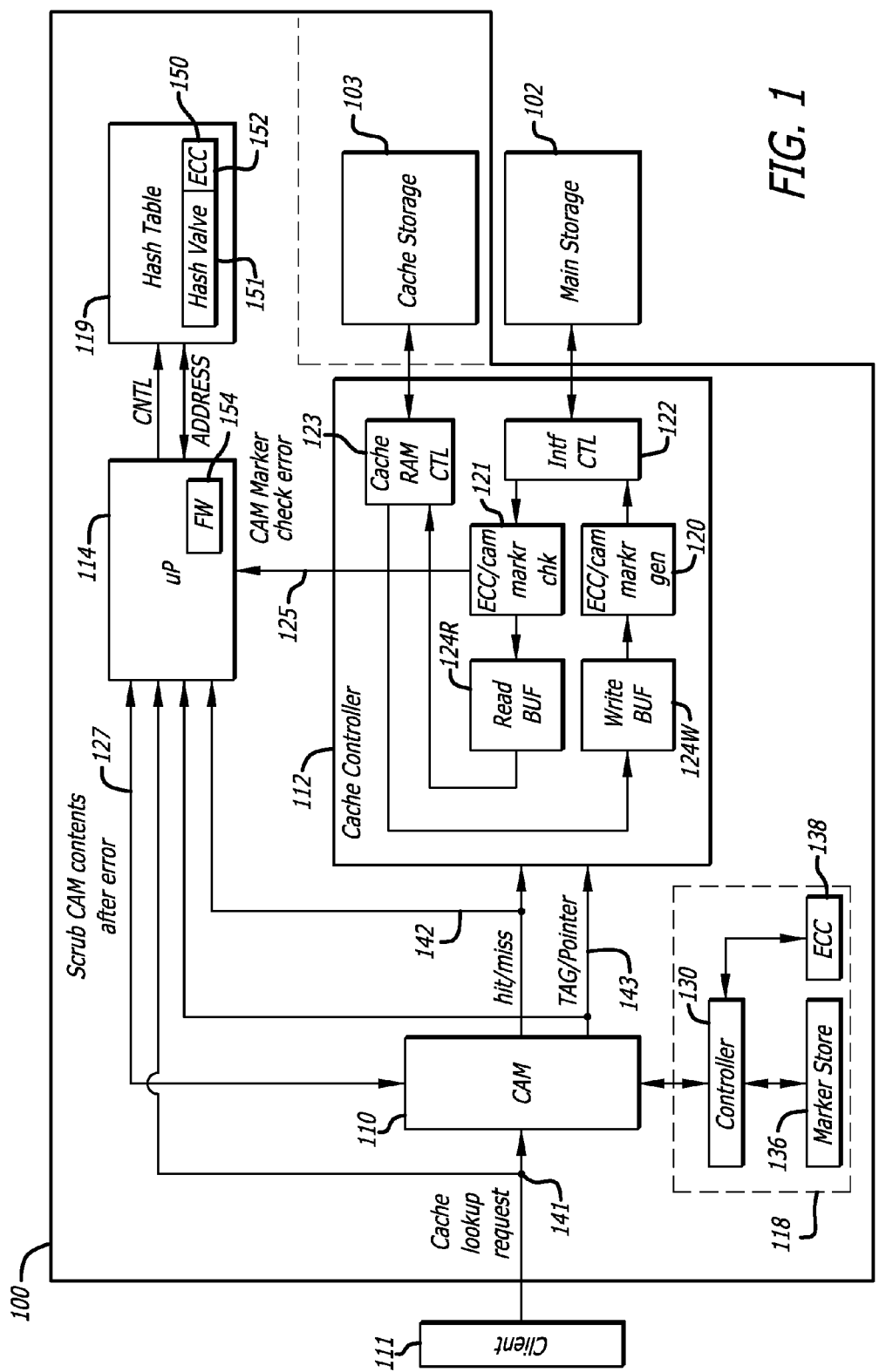
FIG. 1 is a block diagram of a cache memory system coupled to one or more clients and a main storage memory.

In the following detailed description of the embodiments of the invention, numerous specific details are set forth in order to provide a thorough understanding. However, it will be obvious to one skilled in the art that the embodiments of the invention may be practiced without these specific details. In other instances well known methods, procedures, components, and circuits have not been described in detail so as not to unnecessarily obscure aspects of the embodiments of the invention.

INTRODUCTION

Modern application specific integrated circuits (ASICs) require careful attention to the soft-error rate (SER) resulting from bit upsets, typically caused by alpha particle or neutron hits. Bit upset events are becoming more problematic as transistor geometries further shrink with each new generation of ASIC semiconductor manufacturing technology.

To combat soft errors, error correcting codes (ECC) and parity bits have been used in static random access memory (SRAM) devices. However, ECC and parity bits are not directly applicable to content addressable memories (CAMs). The ECC and parity bit used with SRAM devices process the full memory block or word outside of the SRAM in order to detect a bit error. This is not possible with the function of CAM devices where input data is compared with each line of data stored in a CAM to determine a miss (no match) of a hit (match) and the lines that match.

In a CAM compare operation, all words (addresses into memory) stored in lines of a memory array are compared against the incoming data word (client address) for a match. If a word has been corrupted in the array by a soft error (SER) event, the CAM compare operation can result in a false miss status. If the CAM is used in a cache memory system with a write back cache design, a false miss that is undetected can cause data corruption.

In a cache memory system, a true miss properly indicates that a desired cache line is not stored in the cache. A false miss, improperly indicates that a desired cache line is not stored in the cache. With a false miss, the cache line may have actually been resident in write back cache, even though the CAM indicated otherwise. The false miss inadvertently signals the cache control logic to read a missed line from main memory into cache storage memory. A cache line that was modified but not written back to main storage memory, may become corrupted if overwritten. The false miss indication essentially loses track that the cache stores a modified line. Without some sort of false miss checking, the line is re-read from the main storage memory or the next cache level of the cache structure and stored in the cache storage memory, overwriting and corrupting the previously modified line. Without some sort of false miss checking, the modifications to a modified line may be lost.

Also, CAMs supporting write back caches are more susceptible to soft errors. With a write back cache, dirty lines are held longer therein before being written back to the main storage memory. Thus, a write back cache can lead to a greater window of time for soft errors in a CAM and corruption of data in the write back cache.

The embodiments of the invention include a method, apparatus and system for soft error protection of a content addressable memory. To protect against soft errors or some other event that upsets a bit in a CAM, the embodiments of the invention detect false misses generated by a content addressable memory (CAM) device used in cache memory system designs. A marker is generated and stored with each block of data in a main storage memory to determine if there was a false miss generated by the CAM device. Anytime a cache line is read into cache storage memory or written back to main storage memory, the marker value changes its polarity or logic state. A miss generated by the CAM indicates that data at the desired client address is not stored in cache. Upon a read operation into the main storage memory to fill a cache line, the logical state or value of marker is checked to make sure that the cache line of data had previously been evicted, indicating that the data indeed is not presently in the cache and the miss is a true miss. If the marker indicates that the cache line of data with the client address had not been previously evicted, then a false miss may have occurred in the CAM. With a false miss, an error condition is flagged to a microcontroller. To be sure a stored marker value is protected from soft errors in main storage memory, an error correcting code is used to detect and correct the marker value.

Cache Memory System

Referring now to FIG. 1, a cache memory system 100 is illustrated coupled to one or more clients 111 and a main storage memory 102. The one or more clients 111 may be a host processor issuing memory requests to the cache memory system 100 for one or more client addresses to read or write data with the main storage memory 102. The main storage memory 102 typically comprises one or more dynamic random access memory modules. To speed access to data, the cache memory system 100 stores data in a cache storage memory 103 that is of higher performance than the main storage memory 102.

The cache memory system 100 includes a content addressable memory (CAM) 110, a cache controller 112, and a micro-controller 114 coupled together as shown. The cache controller 112 is coupled to the main storage memory 102 and the cache storage memory 103. The cache controller 112 is further coupled to the micro-controller 114 and the content addressable memory 110.

The cache memory system 100 may be a single monolithic integrated circuit including the cache storage memory 103. The cache storage memory may be on the same monolithic integrated circuit chip with the CAM to provide faster access. In alternate embodiment, indicated by a dashed line, the cache storage memory 103 is an external cache storage memory 103 coupled to the cache memory system 100. The cache storage memory or cache memory is usually a local storage or on chip storage device that typically has a small storage capacity but relatively fast read and write access. The cache storage memory is typically higher performance than the main storage memory. The cache storage memory 103 typically comprises one or more memory devices (e.g., static RAM) with higher performance than that of the memory devices (e.g., dynamic RAM) forming the main storage memory 102. In one embodiment of the invention, the cache storage memory may be static random access memory (SRAM) while the main storage memory may be dynamic random access memory (DRAM). The cache storage memory 103 may have its own ECC and/or parity bit generator and checker for each cache line of data stored therein to avoid soft errors.

The main storage memory or main memory 102 may be a remote or separate storage device that typically has a large storage capacity but relatively slow read and write access. The main storage memory may consist of one or more memory modules coupled to the same printed circuit board as the chip 100 with a plurality of DRAM memory devices coupled thereto.

Figure 3A:
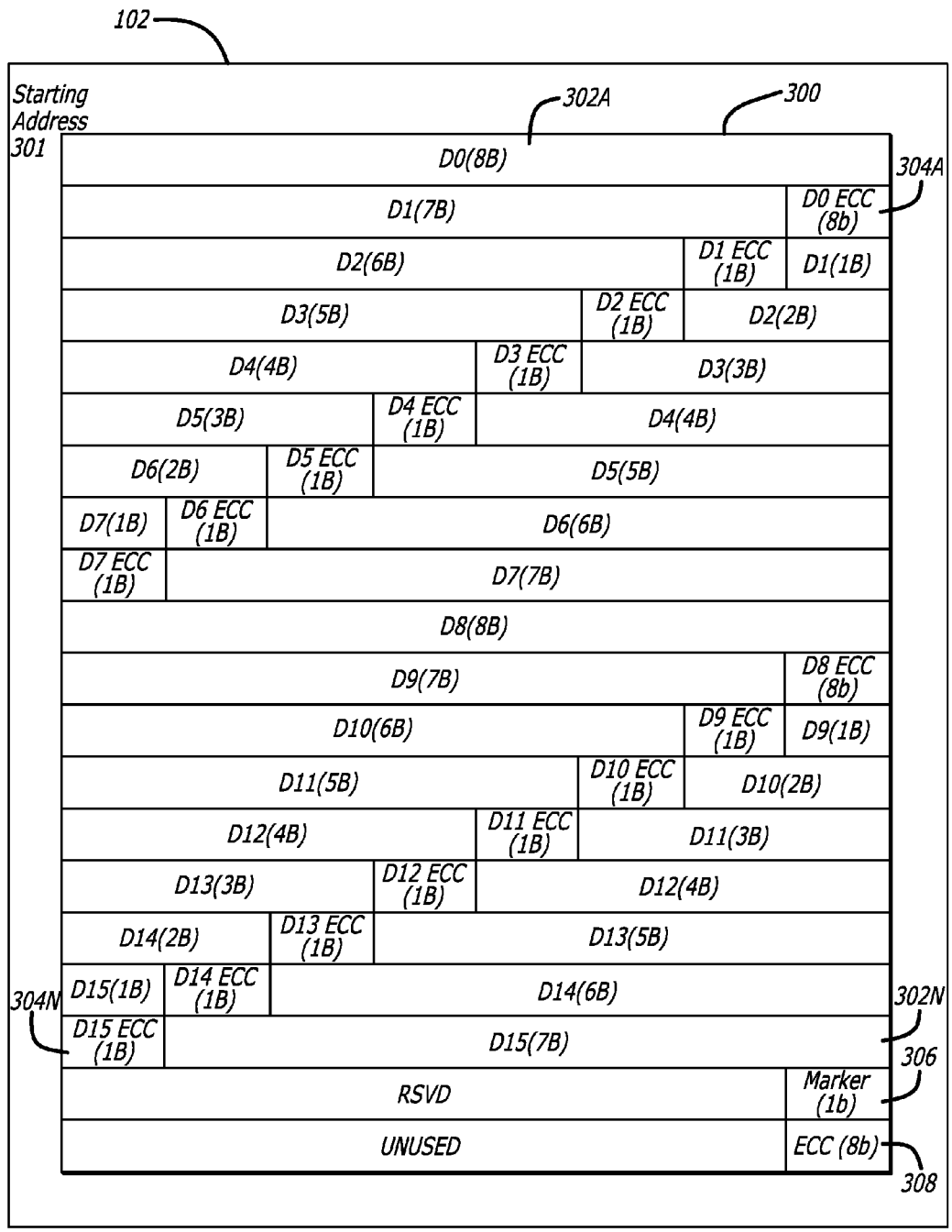
FIG. 3A is a diagram of a block of data stored in main storage memory that represents a cache line.

Referring momentarily to FIG. 3A, an example data block 300 is illustrated that may be stored in main storage memory 102 representing a line of data in cache storage memory 103. Each data block 300 includes a plurality of data words 302A-302N forming a block of data with each data word 302A-302N having a respective data error correction code (ECC) 304A-304N. Each data block 300 includes a CAM marker bit 306 and a respective marker error correction code (ECC) 308 for the marker bit. The CAM marker bit 306 and the respective marker error correction code (ECC) 308 are generated by the cache controller 112. The data error correction code (ECC) 304A-304N for each respective data word 302A-302N may also be generated by the cache controller 112 shown in FIG. 1.

Referring now back to FIG. 1, the cache memory system 100 may further include a hash table 119 coupled to the micro-controller 114 to support protection from soft errors in the CAM causing a false hit. The hash table 119 includes a plurality of hash values 115 each having an ECC value 152 to form a hash line 150.

In an alternate embodiment, to detect false misses, the cache memory system 100 may further include a marker storage system 118 coupled to the content addressable memory 110 to store each marker bit associated with each line of data in the cache.

The cache controller 112 includes a main memory interface controller 122, a cache memory interface controller 123, a main memory read buffer 124R, a main memory write buffer 124W, an ECC/CAM marker generator 120, and an ECC/CAM marker checker 121, coupled together as shown.

The value of the CAM marker bit is generated by the ECC/CAM marker generator 120 as the data streams into the main storage memory 102 from the cache storage memory 103 or another source. In response to a miss, the value of the CAM marker bit is checked by the ECC/CAM marker checker 121 as the data streams out from the main storage memory 102 towards the cache storage memory 103. If the cache controller 112 determines that the miss is a false miss, data that may be streaming out from the main storage memory 102 towards the cache storage memory 103 may not be stored into the cache storage memory 103.

The micro-controller 114 includes firmware 154 to perform various functions within the cache memory system 100. For example, instructions of a software routine to detect false hits may be stored in the firmware 154. Another software routine's instructions that may be stored in the firmware assists the CAM in scrubbing its contents in response to a false hit or a false miss. In the case the CAM needs scrubbing, the microcontroller 114 receives the client address that is coupled into the CAM 110.

Exemplary CAM architectures are disclosed by U.S. Pat. No. 5,351,208 entitled Content Addressable Memory issued on Sep. 27, 1994 to Ching-Lin Jiang and U.S. Pat. No. 4,296,475 entitled Word-Organized, Content Addressable Memory issued on Oct. 20, 1981 to Leendert Nederlof et al.; each of which is incorporated herein by reference to teach the functionality and the elements that may be found in a CAM with a little more detail.

The content addressable memory 110 includes a plurality of CAM lines of memory cells to store addresses into the main storage memory 102. For each CAM line, there is a tag/pointer 143 that points into addresses of the cache storage memory 103. The tag/pointers 143 may also be coupled into the micro-controller 114 so as to initiate a check of a hit within the CAM 110 to determine whether or not a false hit was issued. The hit/miss signals 142 generated by the content addressable memory 110 are coupled into the cache controller 112 and the micro-controller 114. If the cache controller 112 determines a miss is a false miss, it signals to the microcontroller 114 by way of the CAM marker check error signal 125 to scrub the address location of the CAM 110. The micro-controller 114 has a scrub CAM signal 127 coupled to the content addressable memory 110 to communicate to the CAM 110 that an address location therein needs scrubbing.

In an alternate embodiment of the invention, the cache memory system 100 includes a marker storage system 118. The marker storage system 118 includes an address controller 130 to interface with the content addressable memory 110 and a marker storage memory 136. The marker storage system 118 further includes an ECC generator 138 to append an ECC to each stored marker bit.

The data ECC, the CAM marker bit, and the marker ECC are generated by the ECC/CAM marker generator 120 as the data streams into the main storage memory 102 from the cache storage memory 103 or another source. The cache memory interface controller 123 of the cache controller is coupled to the cache storage memory 103 so that it can read data therefrom and write data into the cache storage memory 103. The cache memory interface controller 123 is coupled to the memory read buffer 124R and the memory write buffer 124W.

The write buffer 124W receives data from the cache memory interface controller 123 and temporarily stores the data one or more data words and blocks at a time. As its name implies, write buffer 124W buffers the data from the cache memory interface controller 123 until the ECC/CAM marker generator 120 is ready to receive and process additional data, such as the next block or next word of data.

The read buffer 124R similarly buffers data but in the opposite direction to the cache memory interface controller 123. The read buffer 124R receives data from the marker checker 121 and temporarily stores the data one or more data words and blocks at a time until the cache memory interface controller 123 is ready for more data that is to be written into the cache storage memory 103.

The ECC/CAM marker generator 120 of the cache controller 112 is coupled to the write buffer 124W to receive words and blocks of data for processing. The ECC/CAM marker generator 120 generates the error correction code ECC 304 for each data word 302 as it's streamed from the write buffer 124W to the interface controller 122. The generator 120 further generates the CAM marker bit 306 appended to each data block 300 as it streams from the write buffer 124W, through the generator, and into the interface controller 122. The generator 120 also generates the marker ECC bits 308 to correct errors in the CAM marker bit for each data block 300 of data. The generator 120 couples each data block 300 including the CAM marker bit, and the marker ECC bits 308 into the interface controller 122 for writing into the main storage memory 102.

The interface controller 122 is coupled to the main storage memory 102 and to the ECC/CAM marker generator 120 and the ECC/CAM marker checker 121 as illustrated in FIG. 1. The interface controller 122 reads data from the main storage memory 102 and typically causes the read data to be written into the cache storage memory 103. The interface controller 122 causes write data to be read from the cache storage memory 103, associated with the tag/pointer 143 addressing memory locations therein, and then writes the write data into the main storage memory 102. With the CAM 110, the cache memory system 100 tries to access data from the cache storage memory 103 first, before having to access the data from the main storage memory 102.

The interface controller 122 reads out each block 300 of data from the main storage memory 102 into the ECC/CAM marker checker 121. The checker 121 parses the data block 300 acquiring each word of data 302A-302N (collectively referred to reference number 302) and each respective data ECC 304A-304N (collectively referred to by reference number 304). The checker 121 strips off each data ECC 304 of each data word 302. The checker 121 compares each data word 302 with each data ECC 304 to determine if the data field is correct. If correct, the checker 121 writes each data word into the read buffer 124R, as the block 300 is streamed from main storage memory 102 through the controller 122 and into the read buffer 124R.

The CAM marker bit 306 is checked after the data read from the main storage memory 102 has streamed through the checker. The checker 121 reads the CAM marker 306 and the marker ECC 308 to verify the value of marker bit is error free and if not, correct its value. The checker 121 further checks the logical status or value of the marker bit to determine whether a false miss has occurred as described further herein. If a false miss has occurred, the checker 121 generates a CAM marker check error signal 125 that is coupled into the microcontroller 114 for further processing.

Each data word 302A-302N of a data block 300 stored in the read buffer 124R is coupled into the cache interface controller 123 so that the data can be written into the cache storage memory 103 at a tag/pointer address generated by the CAM 110. The cache location used to populate a new cache line is determined by the cache controller 112 as a result of there being a miss in the CAM 110.

When a client 111, such as a processor, needs to access data that is presumed to be in the main storage memory 102, the cache storage memory 103 is initially consulted first for the desired data. The one or more clients 111 generate a cache memory request with a client address 141 that is coupled into the CAM 110. In this case, the CAM 110 is used to quickly determine if the desired data is stored in the cache storage memory and if so, at what memory location. A true miss indicates that the desired data is not stored in the cache storage memory and must be accessed from some other data storage, e.g., such as the main storage memory of a disk. If the CAM indicates a false miss, the desired data is actually stored in the cache storage memory but it is unknown where. The false miss is particularly problematic in that it indicates that the desired data is not in the cache storage memory and requires access to main storage memory if the data is available, or regeneration of the data at the desired memory location if the data is unavailable in main storage memory.

The cache storage memory 103 may be a write-back cache that performs particularly well with reads and writes to the same memory locations. With a write back cache, the data to be stored in main storage memory is initially written only into the cache storage memory. The write back to the main storage memory and/or a disk is postponed. If a data block in the cache storage memory (cache block) is about to be modified or replaced by new data (e.g., new information or content), the write back to the main storage memory or disk takes place. With a write back cache device being used as the cache storage memory, it is particularly important that the contents of a CAM be protected from soft errors so that it properly generates CAM addresses, a tag or a pointer, pointing to data into the write back cache.

A write back cache may include a dirty bit for each block of data. Each dirty bit tracks which locations of data blocks have been written over or updated. The dirty bit indicates a block of data that has been modified that needs to be written into main storage memory or a disk. Only when modified data is to be evicted from the cache does a write back (also referred to as a lazy write) to the main storage memory or a disk needs to take place.

A read miss and a write miss to a write back cache, indicating a block of data that is to be accessed at a memory location is not in the cache storage memory, may be treated the same or differently. A read miss to a write back cache requires a dirty data block to be read out from the cache storage memory and stored into the main storage memory and the desired data to be read out from the main storage memory and written into the write back cache. Thus two different memory operations are executed on both the cache storage memory and the main storage memory.

With a write miss and writing data into the cache storage memory, no data is needed in return. With a write allocation policy, data blocks associated with the missed write address locations are read out from the main storage memory and written into empty block locations into the cache storage memory. With the proper data now stored into the cache storage memory, a write-hit operation can be performed with the CAM pointing into the cache storage memory so that the data associated with the desired write address can be modified as desired.

With a no-write allocation policy, a write miss to a write back cache may include the operations of reading one or more dirty data blocks out from the cache storage memory and writing them into the main storage memory and then writing the new or updated data block into the write back cache at the evicted memory locations.

Cam and Soft Errors

If a soft error can be detected within a memory, it may be corrected by rewriting the data into the memory cell. To aid in the detection of soft errors, the data may be stored into a memory with error correction and/or a parity bit.

Typically, CAMs do not provide error correction or a parity bit to detect soft errors. Moreover, the design and function of a CAM makes it difficult to check its stored contents for bit flips of a memory cell indicating a soft error. Thus, a CAM may generate a false miss or a false hit due to a soft error.

A false miss generated by a CAM is particularly problematic, because the pointer provided by the CAM address is lost. A false hit generated by a CAM is less of a problem because the information pointed to by the CAM address may be used to detect the false hit.

Reference is now made to FIGS. 2A-2C, illustrating a block diagram of an exemplary CAM with CAM states 200A-200C respectively illustrated to explain how soft errors can affect a CAM and what is done to correct a soft error.

In the CAM state 200A illustrated by FIG. 2A, the CAM is initially stored with the data bits shown in the four right columns for each of five rows associated with the pointer/address zero through four. A client address input is compared row by row with the contents stored in the four right columns of the five rows. A miss is generated if the client address input does not match the contents stored in the CAM. A hit and a pointer/address is generated by the CAM if the client address input matches the contents stored in the CAM. For example, consider the client address input 1001 shown by the CAM state 200A. A comparison operation performed on the CAM with the CAM state 200A would find a hit at pointer/address one. As another example, consider the client address input 1110 to the CAM state 200A. A comparison operation performed in the CAM state 200A with all of its contents would not find any match and a miss signal would be generated.

The change from CAM state 200A to CAM state 200B of the exemplary CAM is now discussed. In the CAM with the CAM state 200A, memory cell 202A stores a logical one and memory cell 204A stores a logical zero. Assume that a soft error occurs in the CAM such that each of these memory cells have their stored data flipped to the opposite logical state to form the CAM state 200B. The CAM state 200B illustrates the CAM with the soft errors. Memory cell 202B has a logical state of zero opposite the logical state of memory cell 202A. Memory cell 204B has a logical state of one opposite that of the logical state of memory cell 204A.

Now consider that a client address input 1001 is coupled into the CAM with the CAM state 200B, for example. Given the CAM state 200B, a comparison operation is performed in the CAM with the client address input 1001 against all of its contents would not find any match, such that a miss signal is generated. In this case, the miss signal is a false miss signal because the memory cell 202B in the CAM state 200B had its logic state flipped due to a soft error from that of memory cell 202A and the CAM state 200A in the CAM. The condition of the CAM generating a false miss signal may be simply referred to as being a false miss.

Now consider another example where a client address input 1110 is applied to the CAM with the CAM state 200B. A comparison operation performed in the CAM state 200B with the client address input 1110 against all of its contents would find a hit at pointer/address three (3). In this case, the hit signal is a false hit signal because the memory cell 204B in the CAM state 300B had its logic state flipped due to a soft error from that of memory cell 204A in the CAM state 200A of the CAM. The condition of the CAM generating a false hit signal may be simply referred to as a false hit. In additional to the false hit signal, the CAM outputs an associated tag or pointer that is incorrect (false tag/pointer). The false tag or pointer may be used to try and read data, such as from a cache storage memory for example. However, the read data pointed to by the false tag of false pointer would not be the proper data to read.

With CAM state 200A of the CAM, the comparison of the client address input 1110 against all of its contents found no hits and a miss signal was generated. In the case of the CAM state 200B of the CAM with the upset bits, the comparison of the client address input 1110 now generates a false hit signal and a false tag/pointer output.

The change from CAM state 200B to CAM state 200C of the exemplary CAM is now discussed. If a false miss and/or a false hit can be detected, the contents stored in one or more memory lines of a CAM can be scrubbed or corrected to the proper contents. If a false miss or a false hit is not respectively detected upon the generation of a miss signal or hit signal, one considers the miss signal or the hit signal to be a true miss or a true hit, respectively.

For example, in response to the false miss with client address input 1001, the memory line one (1) may be scrubbed such that the upset bit 202B illustrated in CAM state 200B, a logical zero, is changed back to the proper bit 202C, a logical one, in the CAM state 200C. If after the scrubbing the client address input 1001 is compared with the CAM state 200C of the CAM, a true hit and the associated tag/pointer (memory line 1) is generated by the CAM.

As another example, in response to the false hit with client address input 1110, the memory line three (3) may be scrubbed such that the upset bit 204B illustrated in CAM state 200B, a logical one, is changed back to the proper bit 204C, a logical one, in the CAM state 200C. If after the scrubbing the client address input 1110 is compared with the CAM state 200C of the CAM, a true miss is generated by the CAM.

Methods and Apparatus for Soft Error Protection

When a CAM is paired with a cache storage memory, there are some operational characteristics that may be advantageously used to detect a false miss generated by a CAM. If a miss signal is generated by the CAM 110 when the cache storage memory 103 is full, the cache controller 112 assumes that a cache line in the cache storage memory 103 needs to be evicted and a new cache line needs to be read out from main storage memory 102 and then written into the cache storage memory 103. If the miss is a false miss, the data associated with the client address is actually stored in the cache storage memory 103, but after checking each address entry, the CAM 110 generates a miss.

In response to a false miss or a true miss, the cache controller 112 goes to read the data from the main storage memory 102 corresponding to the address associated with the miss. If the miss is a false miss, the desired block of data resides in the cache storage memory 103 and thus the data in main storage memory 102 may not be accurate. The desired data in the cache storage memory 103 may have been updated but the data in main storage memory 102 was not. If the miss is a true miss, a block of data has been recently written out from cache storage memory 103 and into the main storage memory 102 at the desired address. Thus, when reading data into new cache lines from the main storage memory 102 in response to a miss, if a marker bit (such as marker bit 306 illustrated in FIG. 3) is used to identify the corresponding data was or was not recently written out from cache storage memory 103 into main storage memory 102, a false miss caused by a bit flip can be indirectly identified. If upon reading data from main storage memory 102 into cache lines in cache storage memory 103, the marker is set to indicate that the data was recently written into main storage memory 102 due to being evicted from the cache storage memory 103, then the miss is a true miss. If upon reading data from main storage memory 102, the marker is cleared to indicate that the data was instead recently read out from main storage memory 102 into cache lines of cache storage memory 103, then the miss generated by the CAM 110 is a false miss, indicating that a bit flip may have occurred in the contents of the CAM 110.

Referring now to FIG. 3A, an example data block 300 is illustrated that may be stored in main storage memory 102 representing a line of data in cache storage memory 103. Each data block 300 includes a plurality of data words 302A-302N forming a block of data with each data word 302A-302N having a respective error correction code (ECC) 304A-304N. A word of data may be 8 bits of data, for example, and may have one or more bits occasionally split up from other bits of the data word for storage in a next address line of memory. The data block 300 may further include reserved bits (RSVD) and unused bits (UNUSED) for future expansion of the data block. Each data block 300 includes a marker bit 306 and a respective error correction code (ECC) 308 for the marker bit.

Figure 3B:
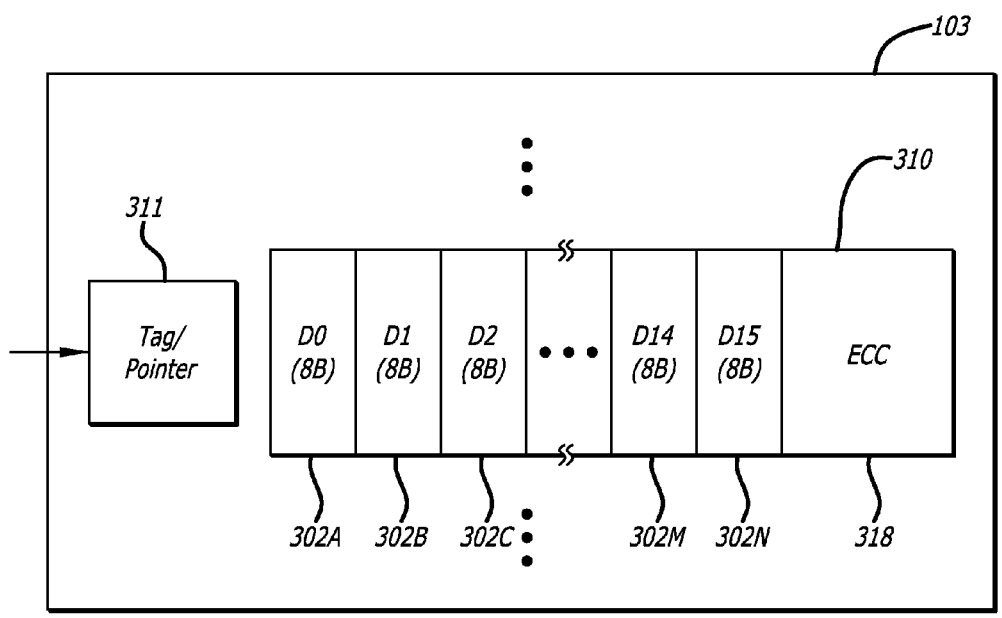
FIG. 3B is a diagram of a line of cache data stored in cache storage memory that is represented by a data block in main storage memory.

FIG. 3B illustrates an exemplary cache line 310 of a plurality of cache lines that may be stored in the cache storage memory 103. Each cache line 310, if unmodified, may correspond to a respective data block 300 stored in main storage memory 102. The cache line 310 includes the words of data 302A-302N and its own error correction code (ECC) 318. Each cache line 310 in the cache storage memory 103 is identified by a tag/pointer address 311. The tag/pointer address 311 may be a hardware tag/pointer or a software tag/pointer. Note that the marker bit 306 is not needed in the cache storage memory 103 so it is not stored therein.

The function of the marker bit 306 shown in FIG. 3A was briefly discussed previously and is further discussed below. As the marker bit 306 may sit within the data block 300 out in the main storage memory, it is also subject to soft errors and a bit flip or logic state change. The respective error correction code (ECC) 308 for the marker bit 306 is provided to detect an error in the marker bit and correct it. To simplify the generation of the ECC 308 and its use, it may be similarly generated and used to detect and correct errors as is the ECC 304A-304N for the data words 302A-302N. Thus, the ECC 308 may be the same size (e.g., 8 bits) as the ECC 304A-304N.

The marker bit 306 is generated by the ECC/marker generator 120 and included in the data block 300 that is stored into the main storage memory 102. If the data block 300 has been recently evicted from the cache storage memory 103, it is to be written into the main storage memory 102 with the marker bit 306 set (e.g., set to logic zero/one) to indicate that it was only recently written out from cache storage memory 103 and into the main storage memory 102 due to the eviction. If a data block 300 is written into main storage memory 102 and read back out so that it can be written into the cache storage memory 103, the marker bit 306 is set to an opposite state (e.g., set to logic one/zero) to indicate that it was only recently read out from main storage memory 102 and stored into the cache storage memory 103.

In response to a miss, a marker check operation is performed of the data block read out from main storage memory in response thereto. If the state of the marker bit 306 of the data block 300 associated with the miss is in a state that was not what was expected, a false miss is likely. With a false miss, the micro-controller 114 receives a CAM marker check error signal from the cache controller 112 and goes on to inform the CAM of the error and cause the CAM to scrub some or all of its contents.

A check for a false hit is a little more straight forward because the CAM provides a hit indication for each client address input against which a check can be made. A hash table 119 is provided that includes a line for every address entry into the CAM. The line in the hash table represents a signature, an expected value that is compressed representing each address entry into the CAM. With each hit, a present hash value is computed by the micro-controller 114 for the client address presented to the CAM that generates a hit. The newly computed hash value is compared against the stored hash value in the hash table 119. If the computed hash value matches the stored hash value, the hit generated by the CAM is a true hit. If the computed hash value does not match the stored hash value, then the hit generated by the CAM is a false hit and the microcontroller causes the CAM to scrub the given entry denoted by the tag/pointer into the CAM 110. To be sure each hash entry is relatively error free, the microcontroller 114 can generate an ECC value that is appended to each hash value. The ECC value for each entry in the hash table can be used by the microcontroller 114 to be relatively sure the state of the hash value that is read out for the given CAM hit is proper.

Referring now to FIG. 4, a flow chart of a method for protecting a cache memory system 100 and its content addressable memory (CAM) from soft errors is illustrated. The process 400 for protecting the cache memory system and the content addressable memory starts at process block 401.

At process block 401, a client address is received by the CAM 110. The client address is associated with a cache memory request.

Next at process block 402, the CAM 110 performs a CAM comparison operation to determine if the client address matches any address stored in the CAM 110. The process 400 then goes to process block 403.

At process block 403, a determination is made whether a hit or a miss has occurred in the CAM with regard to the comparisons made using the received client address. If a hit, the process 400 goes to process block 405. If instead the CAM generates a miss signal from the comparison, the process 400 goes to process block 404.

At process block 405, with the CAM signaling a hit, hit processing occurs to determine if the hit is a false hit or a true hit. If a true hit, normal cache memory operations occur and data is read out from the cache storage memory 103 and provided to the client 111. If a false hit, the micro-controller 114 generates a scrub signal 127 informing the CAM 110 to correct the given address line or memory locations in the CAM. The process 400 can then go to process block 499 and return waiting to receive another client address for comparison.

At process block 404, with the CAM signaling a miss, the marker check bit for the given client address is retrieved from the main storage memory. The process 400 then goes to process block 406.

At process block 406, a marker check operation occurs where a determination is made as to whether the marker bit was bad or good for the given client address. If the marker check was good, indicating a true miss, then the process 400 goes to process block 408. If instead it is determined that the marker bit was bad for the given client address, indicating a false miss, the process 400 goes to process block 409.

At process block 408, with the occurrence of a true miss, normal cache memory flow processing occurs and the block of data is read out from memory and stored as a line in the cache storage memory. The process 400 can then go to process block 499 and wait to receive another client address for comparison.

At process block 409, with the occurrence of a false miss, the error is flagged by generating a marker check error signal or flag 125 to indicate a false miss. The marker check error signal or flag 125 is coupled into the micro-controller 114. The micro-controller 114 has a scrub CAM signal 127 coupled to the content addressable memory 110 to communicate to the CAM that an address location therein needs scrubbing. The process 400 then goes to process block 410.

At process block 410, in response to the false miss, some or all lines storing information in the content addressable memory are scrubbed. Referring momentarily back to FIGS. 2A-2C for example, a false miss occurred with the client input of 1001 due to the upset bit being changed from a logical one (1) 202A in FIG. 2A to a logical zero (0) 202B in FIG. 2B at memory line 1. The CAM is scrubbed at memory line 1 to correct the upset and change the upset bit from a logical zero (0) 202B in FIG. 2B to a logical one (1) 202C in FIG. 2C. The process 400 then goes to process block 499.

At process block 499, the process 400 waits for another client request into memory to occur with a client address that may be associated with a cache memory request. If another client address is received, then the process 400 resumes at process block 401.

CONCLUSION

When implemented in software, aspects of the embodiments of the invention are essentially the code segments or instructions to perform the necessary tasks. The program or code segments can be stored in a processor readable storage medium. The processor readable storage medium may include any medium that can store information. Examples of the processor readable storage medium include an electronic circuit, a semiconductor memory device, a read only memory (ROM), a flash memory, an erasable programmable read only memory (EPROM), a floppy diskette, a CD-ROM, an optical disk, a hard disk, etc. The code segments or instructions may be downloaded via computer networks such as the Internet, Intranet, etc.

While this specification includes many specifics, these should not be construed as limitations on the scope of the disclosure or of what may be claimed, but rather as descriptions of features specific to particular implementations of the disclosure. Certain features that are described in this specification in the context of separate implementations may also be implemented in combination in a single implementation. Conversely, various features that are described in the context of a single implementation may also be implemented in multiple implementations, separately or in sub-combination. Moreover, although features may be described above as acting in certain combinations and even initially claimed as such, one or more features from a claimed combination may in some cases be excised from the combination, and the claimed combination may be directed to a sub-combination or variations of a sub-combination.

The embodiments of the invention are thus described. While embodiments of the invention have been particularly described, they should not be construed as limited by such embodiments, but rather construed according to the claims that follow below.

What is claimed is:

1. A method comprising:
storing a marker bit associated with each data block stored in a random access memory (RAM), states of the marker bit representing whether the data block was recently read from the RAM or recently written into the RAM;
generating a first state of the marker bit associated with each data block written into the RAM;
receiving a client address pointing to a starting address of a data block stored in the RAM;
comparing the client address against one or more addresses stored in a content addressable memory (CAM) to determine a hit indicating the client address was stored in the CAM or a miss indicating the client address was not stored in the CAM;
updating the first state to a second state opposite the first for each marker bit associated with each data block read out of the RAM; and
in response to a miss, checking a state of the marker bit associated with the data block pointed to by the client address.

2. The method of claim 1,
wherein the states of the marker bit represent whether the data block was recently read from the RAM into a cache memory system or recently written into the RAM from the cache memory system.

3. The method of claim 2, wherein
in response to the checking, it is determined that the state of the marker bit indicates that the data block was recently read from the RAM into the cache memory system; and
the method further includes
signaling a marker check error indicating that the miss was a false miss,
wherein the CAM is included in the cache memory system, and
wherein the false miss is a cache miss of the cache memory system that is generated by the CAM.

4. The method of claim 3, further comprising:
in response to the marker check error, scrubbing the one or more addresses stored in the CAM.

5. The method of claim 2, wherein during the checking
it is determined that the state of the marker bit indicates that the data block was recently written into the RAM;
the method further includes
reading the data block from the RAM associated with the client address into the cache memory system.

6. The method of claim 5, wherein
the miss further indicates that the client address is not associated with any data block stored in a cache storage memory; and
in response to the miss, the method further includes
storing the data block read out from the RAM associated with the client address into the cache storage memory; and
storing the client address into the CAM to point to a starting address location into the cache storage memory where the data block was stored.

7. The method of claim 2, wherein
the hit further indicates that the client address is associated with a data block stored in a cache storage; and
the method further includes
in response to a hit, pointing to a starting address location in the cache storage memory for the data block associated with the client address.

8. The method of claim 2, wherein
in response to a hit,
generating a computed hash value from the client address,
reading a stored hash value out of a hash table corresponding to a tag generated by the CAM; and
comparing the stored hash value against the computed hash value; and
if the stored hash value does not match the computed hash value then the hit is a false hit.

9. The method of claim 8, further comprising:
in response to the false hit, scrubbing the address stored in the CAM associated with the tag of the false hit.

10. A system comprising:
a first memory for storing a plurality of data blocks;
a second memory to store address entries, wherein the second memory is a content addressable memory (CAM) for comparing a client supplied address with the stored address entries to generate tag pointers, the CAM to generate a miss signal if no stored address entry matches the client supplied address into the first memory; and
a controller coupled to the CAM and the first memory, the controller to generate a first state of a marker bit associated with each data block written into the first memory, the controller to update the state to a second state opposite the first for each marker bit associated with each data block read out of the first memory;
wherein in response to the miss signal and the client supplied address into the first memory for which the miss occurred, the controller further to check the state of marker bit associated with the data block in memory addressable by the client supplied address.

11. The system of claim 10,
wherein the stored address entries are memory address entries that address memory data blocks,
wherein the client supplied address is a memory address that addresses a memory data block, and
wherein each marker bit represents whether the associated data block was recently read from the first memory into a cache memory system or recently written into the first memory from the cache memory system.

12. The system of claim 11, wherein
in response to the check of the state of the marker bit, the controller detects an unexpected state and generates an error signal that is coupled to the CAM.

13. The system of claim 12, wherein
in response to the error signal, the CAM scrubs one or more address entries.

14. The system of claim 11, wherein the controller is a cache controller and the first memory is a main storage memory, and the system further comprises:
a cache storage memory coupled to the cache controller, the cache storage memory to store one or more data blocks at starting addresses associated with one or more respective tag pointers of the CAM that are associated with one or more respective client supplied addresses.

15. The system of claim 14, wherein
the cache storage memory has better access times than the main storage memory, and
a capacity of the cache storage memory is less than a capacity of the main storage memory.

16. The system of claim 14, wherein
a stored address entry matches the client supplied address into the first memory, and
the CAM generates a hit signal and a tag pointer into the cache storage memory where one or more lines of data may be read out from or written into the cache storage memory.

17. The system of claim 14, further comprising:
a microcontroller coupled to the cache controller and the CAM, the microcontroller to receive the miss signal and the client supplied address from the cache controller, the microcontroller including firmware to cause the CAM to scrub at least one memory line therein in response to the miss signal and the client supplied address.

18. The system of claim 14, wherein the cache controller includes:
an error correction code and marker (ECC/marker) generator coupled between the cache storage memory and the main storage memory, the ECC/marker generator to receive one or more data blocks for writing into the main storage memory, generate and append an error correction code (ECC) and a marker bit to each data block, the ECC/marker generator to couple each data block with appended ECC and marker bit into the main storage memory; and
an error correction code and marker (ECC/marker) checker coupled between the cache storage memory and the main storage memory, the ECC/marker checker to receive each data block with appended ECC and marker bit read out from the main storage memory in response to a client supplied address, the ECC/marker checker further to check for errors in the block of data in response to the error correction code (ECC) and to check a state of the marker bit against an expected state of the marker bit to detect a false miss generated by the CAM and generate an error signal
wherein the CAM is included in a cache memory system, and
wherein the false miss is a cache miss of the cache memory system that is generated by the CAM of the cache memory system.

19. The system of claim 18, further comprising:
a microcontroller coupled to the ECC/marker checker and the CAM, the microcontroller to receive the error signal and the client supplied address, the microcontroller to cause the CAM to scrub at least one memory line therein in response to the error signal and the client supplied address.

20. A cache memory controller comprising:
a write buffer to store one or more blocks of data;
an error correction code and marker (ECC/marker) generator coupled to the write buffer to receive the one or more blocks of data, the ECC/marker generator to generate and append an error correction code (ECC) and a marker bit to each block of data received from the write buffer;
an interface controller coupled to the ECC/marker generator to receive each block of data with the appended ECC and the appended marker bit, the interface controller for writing and reading blocks of data with the appended ECC and the appended marker bit into and out of a main storage memory; and
an error correction code and marker (ECC/marker) checker coupled to the interface controller to receive a block of data with its respective appended ECC and its respective appended marker bit read out from the main storage memory associated with a client supplied address, the ECC/marker checker to check for errors in the block of data in response to the error correction code (ECC) and to check a state of the marker bit against an expected state of the marker bit to detect a false miss generated by a content addressable memory.

21. The system of claim 20,
wherein the content addressable memory is included in a cache memory system, and
wherein the false miss is a cache miss of the cache memory system that is generated by the content addressable memory of the cache memory system.

22. The cache memory controller of claim 21, wherein
the expected state of the marker bit indicating a false cache miss is one indicating that the block of data was previously read out of the main storage memory into the cache memory system.

23. The cache memory controller of claim 22, wherein
the state of the marker bit indicating a true cache miss is one indicating that the block of data was not previously read out of the main storage memory into the cache memory system.

24. The cache memory controller of claim 22, wherein
in response to detecting a false cache miss, the ECC/marker checker to signal to scrub at least one entry in the content addressable memory associated with the client supplied address generating the false cache miss.

25. The cache memory controller of claim 21, further comprising:
a read buffer coupled to the ECC/marker checker to receive one or more blocks of data stripped of their respective ECC and their respective marker bit, the read buffer to store the one or more blocks of data received from the ECC/marker checker; and
a cache interface controller coupled to the read buffer and the write buffer, the cache interface controller to receive the one or more blocks of data from the read buffer and store them in a cache storage memory, the cache interface controller to further read one or more blocks of data from the cache storage memory and coupled them into the write buffer.

* * * * *